United States Patent
Yang et al.

(10) Patent No.: US 10,997,348 B2
(45) Date of Patent: May 4, 2021

(54) METAL CUT REGION LOCATION METHOD AND SYSTEM

(71) Applicant: TAIWAN SEMICONDUCTOR MANUFACTURING COMPANY, LTD., Hsinchu (TW)

(72) Inventors: Jung-Chan Yang, Longtan Township (TW); Fong-Yuan Chang, Hsinchu (TW); Li-Chun Tien, Tainan (TW); Ting Yu Chen, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/580,874

(22) Filed: Sep. 24, 2019

(65) Prior Publication Data

US 2020/0104448 A1 Apr. 2, 2020

Related U.S. Application Data

(60) Provisional application No. 62/738,823, filed on Sep. 28, 2018.

(51) Int. Cl.
*G06F 30/392* (2020.01)
*G06F 30/394* (2020.01)

(52) U.S. Cl.
CPC .......... *G06F 30/392* (2020.01); *G06F 30/394* (2020.01)

(58) Field of Classification Search
CPC .............................. G06F 30/392; G06F 30/394
USPC ....................................................... 716/119
See application file for complete search history.

(56) References Cited

U.S. PATENT DOCUMENTS

| 6,385,761 | B1 * | 5/2002 | Breid ................. H01L 27/0207 |
| | | | 716/104 |
| 7,260,442 | B2 | 8/2007 | Hwang et al. |
| 9,256,709 | B2 | 2/2016 | Yu et al. |
| 9,837,398 | B1 | 12/2017 | Rowhani et al. |
| 9,977,854 | B2 * | 5/2018 | Rowhani ............... G06F 30/394 |
| 10,121,875 | B1 * | 11/2018 | Ho ....................... H01L 21/3086 |
| 10,523,188 | B2 * | 12/2019 | Kim ..................... H01L 27/0207 |
| 2004/0195690 | A1 | 10/2004 | Flohr |
| 2005/0044522 | A1 * | 2/2005 | Maeda ................. H01L 27/0207 |
| | | | 716/53 |
| 2009/0193367 | A1 * | 7/2009 | Deppe ....................... G03F 1/44 |
| | | | 716/100 |
| 2010/0162187 | A1 * | 6/2010 | Penzes .................... G06F 30/39 |
| | | | 716/122 |

(Continued)

FOREIGN PATENT DOCUMENTS

DE 102017118336 5/2018

OTHER PUBLICATIONS

Office Action dated Jun. 16, 2020 from corresponding application No. TW 108135322.

(Continued)

*Primary Examiner* — Suresh Memula
(74) *Attorney, Agent, or Firm* — Hauptman Ham, LLP

(57) ABSTRACT

A method of generating an IC layout diagram includes positioning one or more cells in an IC layout diagram and overlapping the one or more cells with a first metal layer cut region based on a first metal layer cut region alignment pattern. The first metal layer cut region alignment pattern includes a pattern pitch equal to a height of the one or more cells.

20 Claims, 10 Drawing Sheets

(56) References Cited

U.S. PATENT DOCUMENTS

| | | | |
|---|---|---|---|
| 2011/0049575 A1* | 3/2011 | Tanaka | H01L 27/0207 257/206 |
| 2013/0126978 A1* | 5/2013 | Becker | H01L 21/823821 257/369 |
| 2014/0040838 A1 | 2/2014 | Liu et al. | |
| 2014/0097493 A1* | 4/2014 | Baek | H01L 29/6681 257/347 |
| 2014/0282287 A1 | 9/2014 | Hsu et al. | |
| 2014/0327050 A1* | 11/2014 | Hsieh | H01L 21/768 257/208 |
| 2015/0048424 A1 | 2/2015 | Tien et al. | |
| 2015/0278429 A1 | 10/2015 | Chang | |
| 2015/0286765 A1 | 10/2015 | Wang et al. | |
| 2016/0147927 A1* | 5/2016 | Chiang | G06F 30/392 257/401 |
| 2016/0320706 A1 | 11/2016 | Hsu et al. | |
| 2017/0124243 A1 | 5/2017 | Chang et al. | |
| 2017/0317063 A1* | 11/2017 | Chang | G06F 30/392 |
| 2018/0018419 A1 | 1/2018 | Rowhani et al. | |
| 2018/0061764 A1 | 3/2018 | Zohrabyan et al. | |
| 2018/0096090 A1* | 4/2018 | Wu | G06F 30/392 |
| 2018/0144082 A1* | 5/2018 | Hanchinal | H01L 21/027 |
| 2018/0342523 A1* | 11/2018 | Chen | G06F 30/39 |
| 2019/0155984 A1* | 5/2019 | Chen | H01L 27/0207 |
| 2019/0165145 A1* | 5/2019 | Ghani | H01L 29/0847 |
| 2020/0004914 A1* | 1/2020 | Peng | G06F 30/392 |
| 2020/0074043 A1* | 3/2020 | Chang | G06F 30/398 |
| 2020/0104447 A1* | 4/2020 | Peng | G06F 30/394 |
| 2020/0104451 A1* | 4/2020 | Huang | G06F 30/39 |
| 2020/0104462 A1* | 4/2020 | Chen | H01L 27/0924 |
| 2020/0134122 A1* | 4/2020 | Huang | H01L 27/0924 |
| 2020/0134124 A1* | 4/2020 | Sue | G06F 30/394 |
| 2020/0134125 A1* | 4/2020 | Huang | H01L 23/528 |
| 2020/0242294 A1* | 7/2020 | Chen | G06F 30/3953 |
| 2020/0328201 A1* | 10/2020 | Li | H01L 29/78696 |
| 2020/0380194 A1* | 12/2020 | Hsu | G06F 30/392 |

OTHER PUBLICATIONS

Office Action dated Feb. 22, 2021 for corresponding case No. 10 2019 125 900.2. (pp. 1-7).

Notice of Allowance dated Jan. 26, 2021 for corresponding case No. TW 10-2019-0120011. English translation attached on p. 1. (pp. 1-7).

* cited by examiner

METAL CUT REGION LOCATION METHOD AND SYSTEM

PRIORITY CLAIM

The present application claims the priority of U.S. Provisional Application No. 62/738,823, filed Sep. 28, 2018, which is incorporated herein by reference in its entirety.

BACKGROUND

An integrated circuit (IC) typically includes a number of semiconductor devices represented in an IC layout diagram. An IC layout diagram is hierarchical and includes modules which carry out higher-level functions in accordance with the semiconductor device's design specifications. The modules are often built from a combination of cells, each of which represents one or more semiconductor structures configured to perform a specific function.

To form the higher-level modules and enable external connections, cells and other IC features are routed to each other by interconnect structures formed in multiple overlying metal layers. Cell placement and interconnect routing are part of an overall design process for the IC.

Various electronic design automation (EDA) tools are used to generate, revise, and verify designs for semiconductor devices while ensuring that design and manufacturing specifications are met.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
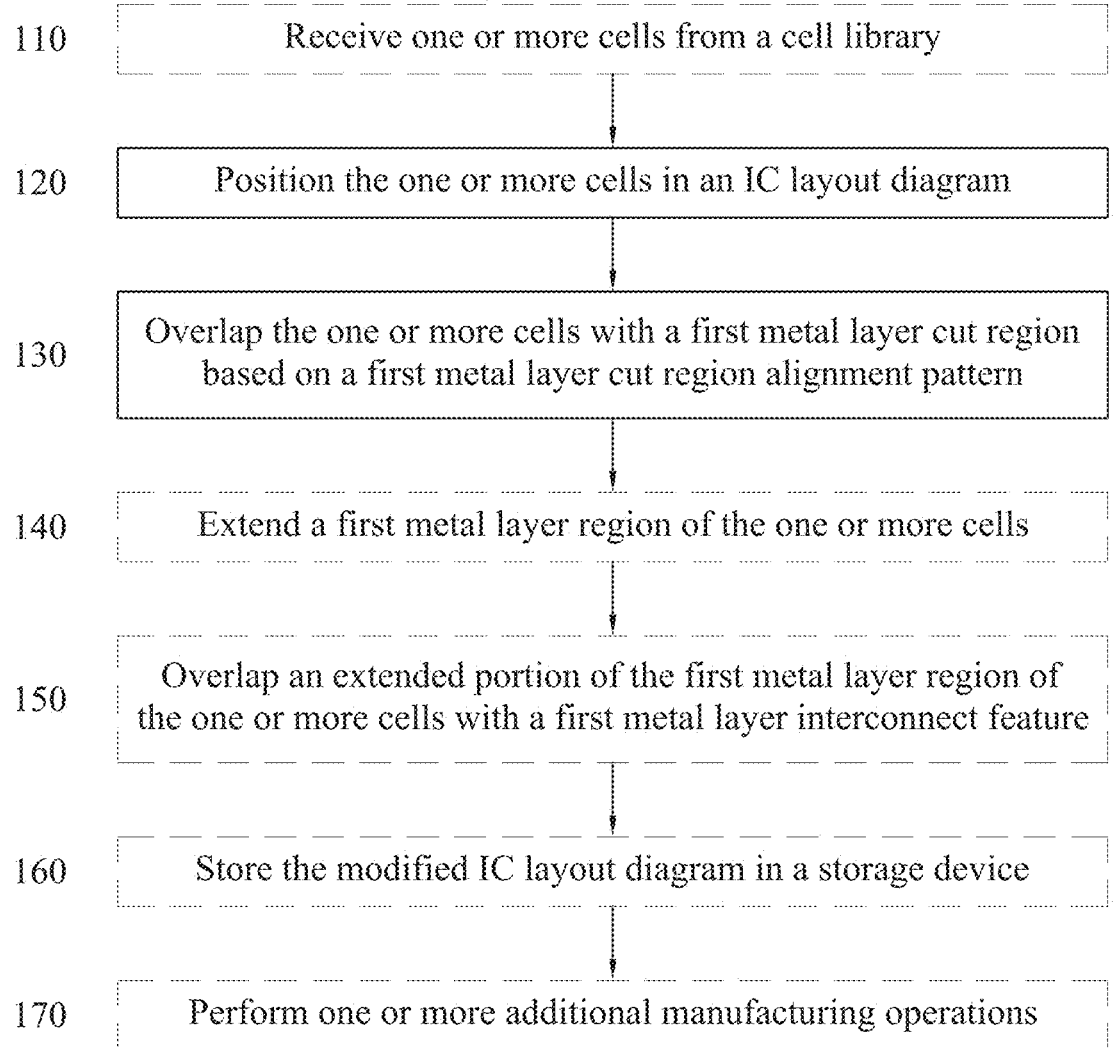
FIG. 1 is a flowchart of a method of generating an IC layout diagram, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, generating an IC layout diagram includes applying a first metal layer cut region alignment pattern to one or more cells as part of positioning the one or more cells in the IC layout diagram. By overlapping the one or more cells with at least one first metal layer cut region based on the first metal layer cut region alignment pattern, electrical interconnect routing flexibility is improved compared to approaches that do not include applying a first metal layer cut region alignment pattern to one or more cells positioned within an IC layout diagram, e.g., approaches in which first metal layer cut regions are defined at the cell level.

Embodiments of the IC layout diagram generation and other manufacturing flow operations are provided in a method 100, depicted in FIG. 1 and illustrated using the non-limiting examples of FIGS. 2A-3D. FIGS. 2A-2D illustrate an example of generating an IC layout diagram based on a first metal layer cut region alignment pattern corresponding to a height of a single cell, and FIGS. 3A-3D illustrate an example of generating an IC layout diagram based on a first metal layer cut region alignment pattern corresponding to a combined height of two cells.

FIG. 1 is a flowchart of method 100 of generating an IC layout diagram, in accordance with some embodiments. In some embodiments, generating the IC layout diagram is part of operating an IC manufacturing system. In some embodiments, generating the IC layout diagram includes generating an IC layout diagram corresponding to a plurality of transistors, e.g., planar transistors and/or fin field-effect transistors (FinFETs). The operations of method 100 are capable of being performed as part of a method of forming one or more semiconductor devices, non-limiting examples of which include memory circuits, logic devices, processing devices, signal processing circuits, or the like.

In some embodiments, the operations of method 100 are performed in the order depicted in FIG. 1. In some embodiments, the operations of method 100 are performed in an order other than the order depicted in FIG. 1. In some embodiments, one or more operations are performed before, between, during, and/or after performing one or more operations of method 100.

In some embodiments, some or all of method 100 is executed by a processor of a computer. In some embodiments, some or all of method 100 is executed by a processor 402 of an IC layout generation system 400, discussed below with respect to FIG. 4.

Some or all of the operations of method 100 are capable of being performed as part of a manufacturing flow, e.g., a manufacturing flow discussed below with respect to an IC manufacturing system 500 and FIG. 5.

FIGS. 2A-2D depict an IC layout 200 at various stages of generating IC layout 200 by executing one or more operations of method 100, in some embodiments. IC layout 200 includes cells C1 and C2, second metal layer tracks M2T1-M2T8 having a second metal layer pitch M2P, and additional features as discussed below.

FIGS. 3A-3D depict an IC layout 300 at various stages of generating IC layout 300 by executing one or more operations of method 100, in some embodiments. IC layout 300 includes cells C3 and C4, second metal layer tracks M2T1-M2T12 having second metal layer pitch M2P, and additional features as discussed below.

IC layouts 200 and 300 are simplified for the purpose of clarity. In various embodiments, one or both of IC layouts 200 or 300 includes features in addition to those depicted in FIGS. 2A-3D, e.g., one or more transistor elements, power rails, isolation structures, interconnect features, or the like. Each of FIGS. 2A-3D further depicts an X direction and a Y direction.

At operation 110, in some embodiments, one or more cells are received. Receiving the one or more cells includes receiving at least one cell of the one or more cells including at least one first metal layer region extending lengthwise in a first metal layer direction. In some embodiments, receiving the one or more cells includes receiving at least one cell of the one or more cells including at least one metal zero via region overlapping at least one first metal layer region.

A metal region, e.g., a first metal layer region, is a region in the IC layout diagram included in the manufacturing process as part of defining one or more segments of one or more conductive materials in a metal layer, e.g., a first metal layer, of an IC device configured to form an electrical connection between one or more underlying contact and/or via structures, one or more overlying via structures, and/or one or more adjacent metal segments.

A via region, e.g., a metal zero via region, is a region in the IC layout diagram included in the manufacturing process as part of defining a via structure including one or more segments of one or more conductive layers in the IC device configured to form an electrical connection between one or more underlying metal segments and/or contact or gate structures and one or more overlying metal segments, e.g., one or more first metal layer segments. A metal zero via region defines a via structure configured to form an electrical connection between a first metal layer segment and a segment of an underlying conductive layer, e.g., a metal zero layer, defined at a cell level of an IC layout hierarchy.

In some embodiments, receiving the one or more cells includes receiving at least one cell of the one or more cells including one or more first metal layer regions corresponding to a first mask and one or more second metal layer regions corresponding to a second mask different from the first mask.

In various embodiments, the first and second masks correspond to first and second mask sets of a manufacturing flow. Each of the first and second mask sets defines a subset of IC features having dimensions based on a standard feature size, and the subsets of features are arranged in a complementary manner to form combined features having dimensions smaller than those of the features formed by a single one of the mask sets.

In some embodiments, receiving the one or more cells includes receiving at least one cell of the one or more cells including first and second sets of first metal layer regions corresponding to the first and second masks, the first metal layer regions of the first set alternating with the first metal layer regions of the second set along a direction perpendicular to the first metal layer direction.

In various embodiments, receiving the one or more cells includes receiving one or more layouts of one or more of a standard cell, a logic cell, a memory cell, an engineering change order (ECO) cell, a custom cell, a physical device cell, or another predefined IC device component.

Receiving the one or more cells includes receiving each of the one or more cells having a border and a corresponding cell height defined in the first metal layer direction between first and second border segments, the one or more cells thereby having a cell height in the first metal layer direction. In various embodiments, the cell height of the one or more cells corresponds to the height of a single cell or the combined heights of multiple cells. In various embodiments, receiving the one or more cells includes receiving multiple cells having a same cell height or receiving multiple cells including at least one cell having a cell height different from at least one other cell height of the multiple cells.

In some embodiments, receiving the one or more cells includes receiving the one or more cells from a cell library. In various embodiments, receiving the one or more cells from a cell library includes receiving the one or more cells from a database, from a plurality of electronic files, and/or over a network. In some embodiments, receiving the one or more cells includes receiving the one or more cells from cell library 420 of IC layout generation system 400, discussed below with respect to FIG. 4.

In some embodiments, receiving the one or more cells includes receiving at least one cell of the one or more cells free from including a first metal layer cut region. A metal layer cut region, e.g., a first metal layer cut region, is a region in the IC layout diagram included as part of defining one or more portions of one or more metal segments, e.g., first metal layer segments, of an IC device that are removed in the manufacturing process, e.g., by an etching process, subsequent to the formation of the one or more segments. The one or more removed portions are then filled with a dielectric layer, thereby electrically isolating the corresponding one or more metal segments or remaining segment pieces from adjacent features in the IC device.

To define a portion of a metal segment that is removed in the manufacturing process, a metal layer cut region extends lengthwise in a direction perpendicular to a direction in which the corresponding metal segment extends lengthwise. Accordingly, a first metal layer cut region extends lengthwise in a direction perpendicular to the first metal layer direction.

In some embodiments, the manufacturing process includes first and second mask sets, each corresponding to one or more first metal layer cut regions, and receiving the one or more cells includes receiving at least one cell of the one or more cells free from including a first metal layer cut region corresponding to a given one of the first or second mask sets or to both of the first and second mask sets.

Figure 2A:
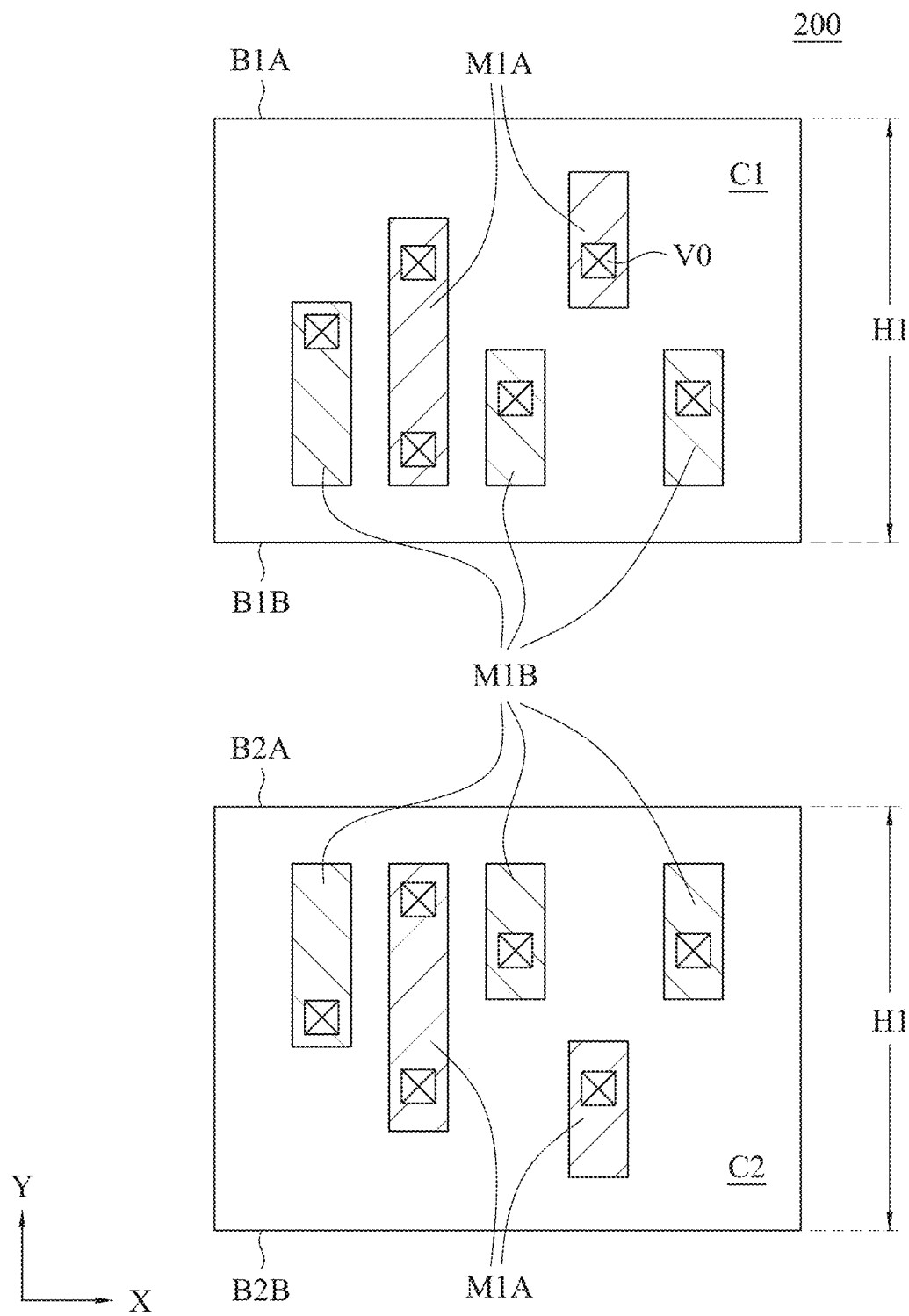
FIG. 2A-2D are depictions of an IC layout diagram at various stages of generating the IC layout diagram, in accordance with some embodiments.

In some embodiments, receiving the one or more cells includes receiving one or both of cells C1 and C2 as depicted in FIG. 2A. Each of cells C1 and C2 is received including first metal layer regions M1A and M1B extending lengthwise in the Y direction and metal zero via regions V0 (only one labeled for clarity) overlapping first metal layer regions M1A and M1B. First metal layer regions M1A correspond to a first mask set, first metal layer regions M1B correspond to a second mask set different from the first mask set, and each of cells C1 and C2 is free from including a first metal layer cut region corresponding to either of the first or second mask sets. Cell C1 has a height H1 in the Y direction between border segments B1A and B1B, and cell C2 has height H1 in the Y direction between border segments B2A and B2B.

Cells C1 and C2 are depicted in FIG. 2A prior to being positioned in IC layout diagram 200, e.g., by executing operation 120 discussed below. In the embodiment depicted in FIG. 2A, cells C1 and C2 are received having positions independent of each other. In some embodiments, cells C1 and C2 are received having border segment B1B of cell C1 abutting border segment B2A of cell C2, cells C1 and C2 thereby being received abutting each other.

Figure 3A:
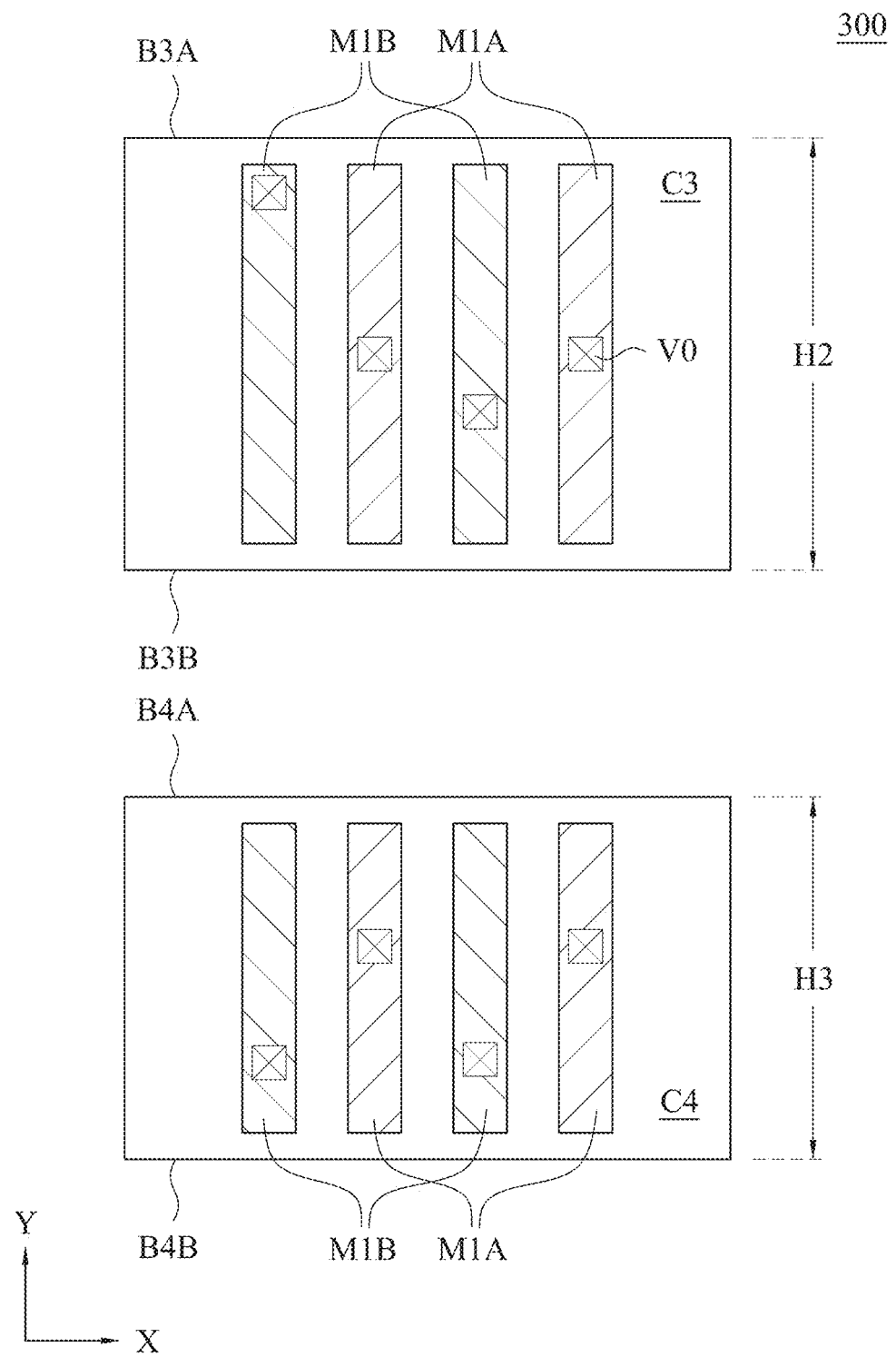
FIGS. 3A-3D are depictions of an IC layout diagram at various stages of generating the IC layout diagram, in accordance with some embodiments.

In some embodiments, receiving the one or more cells includes receiving cells C3 and C4 as depicted in FIG. 3A. Each of cells C3 and C4 is received including first metal layer regions M1A and M1B extending lengthwise in the Y direction and corresponding to the respective first and second mask sets, metal zero via regions V0 (only one labeled for clarity) overlapping first metal layer regions M1A and M1B, and is free from including a first metal layer cut region corresponding to either of the first or second mask sets. Cell C3 has a height H2 in the Y direction between border segments B3A and B3B, and cell C4 has height H3 in the Y direction different from height H2 and between border segments B4A and B4B.

Cells C3 and C4 are depicted in FIG. 3A prior to being positioned in IC layout diagram 300, e.g., by executing operation 120 discussed below. In the embodiment depicted in FIG. 3A, cells C3 and C4 are received having positions independent of each other. In some embodiments, cells C3 and C4 are received having border segment B3B of cell C3 abutting border segment B4A of cell C4, cells C3 and C4 thereby being received abutting each other.

Figure 3B:
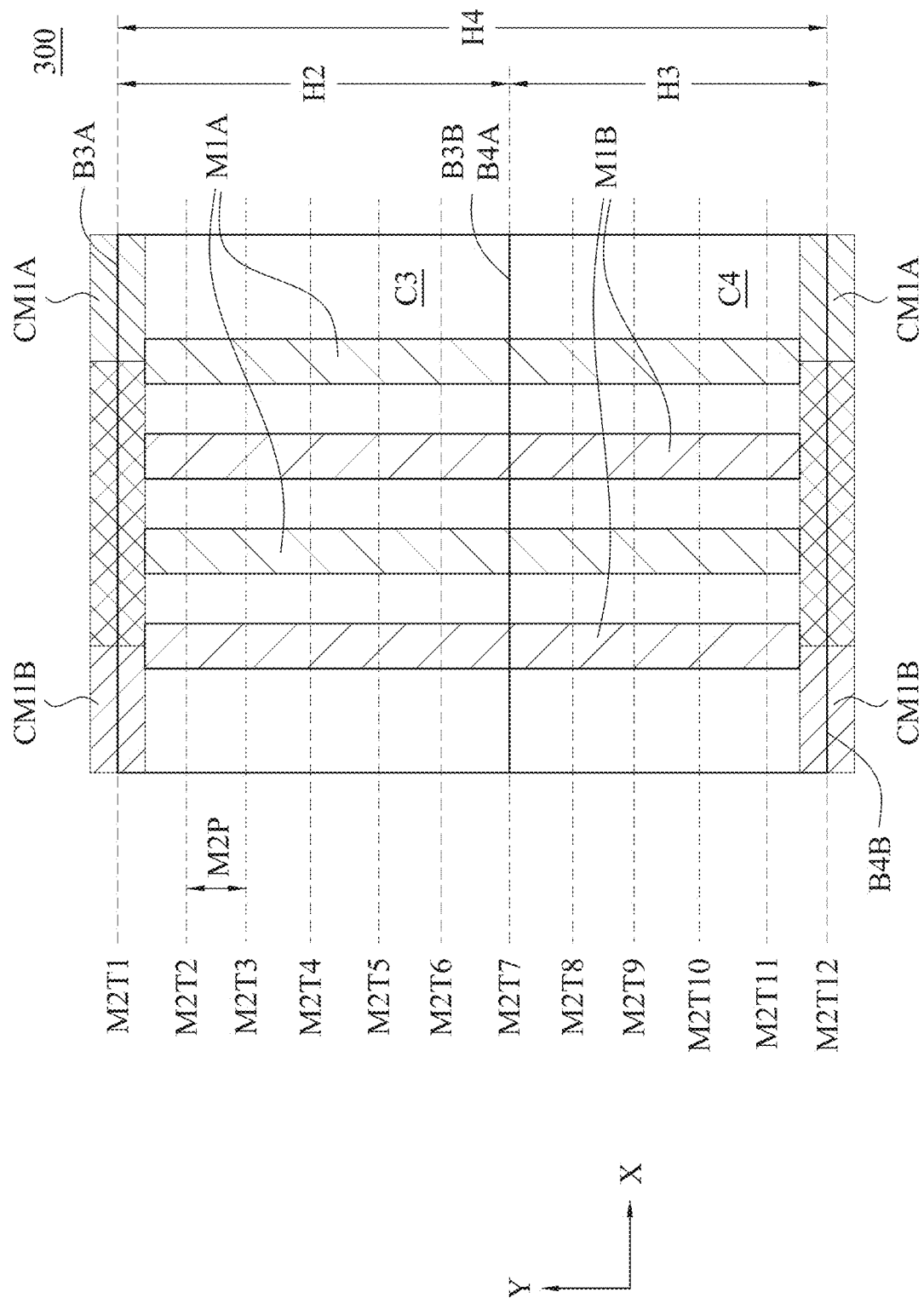

In various embodiments, receiving the one or more cells includes the cell height of the one or more cells corresponding to height H1 of cell C1 depicted in FIG. 2A or corresponding to the sum of heights H2 and H3 of respective cells C3 and C4 depicted in FIG. 3A, also depicted as a height H4 in FIG. 3B.

In some embodiments, receiving the one or more cells includes receiving the one or more cells using a processor of a computer. In some embodiments, receiving the one or more cells includes receiving the one or more cells using a processor 402 of IC layout generation system 400, discussed below with respect to FIG. 4.

At operation 120, the one or more cells are positioned in the IC layout diagram. Positioning the one or more cells in the IC layout diagram includes positioning the one or more cells relative to tracks in the IC layout diagram. The tracks, e.g., second metal layer tracks, are parallel lines having a pitch in the first metal layer, or pitch, direction and extending in a track direction perpendicular to the first metal layer direction. The tracks define locations of metal regions, e.g., second metal layer regions, in the IC layout diagram used to define metal segments extending lengthwise in the track direction in a metal layer, e.g., a second metal layer, of the IC device manufactured based on the IC layout diagram.

A pitch defines a multiple by which corresponding metal segments are separated in the pitch direction. In some embodiments, aligning the metal segments to have the pitch includes centering each metal region on a corresponding track such that a width of each metal region is divided in half by the track. In some embodiments, aligning the metal segments to have the pitch includes aligning the metal regions in the pitch direction based on a common point along the widths of the metal regions without centering each metal region on a corresponding track.

The tracks or common points thereby define a plurality of locations along the pitch direction at which a metal region and thereby a corresponding metal segment is potentially located. In various embodiments, aligning the metal segments to have the pitch includes positioning at least one metal region at each possible location along the pitch direction, or positioning the metal regions by omitting one or more possible locations along the pitch direction.

In some embodiments, first and second track subsets correspond to the first and second mask sets, the first subset of tracks alternating with the second subset of tracks along the track direction.

Figure 2B:
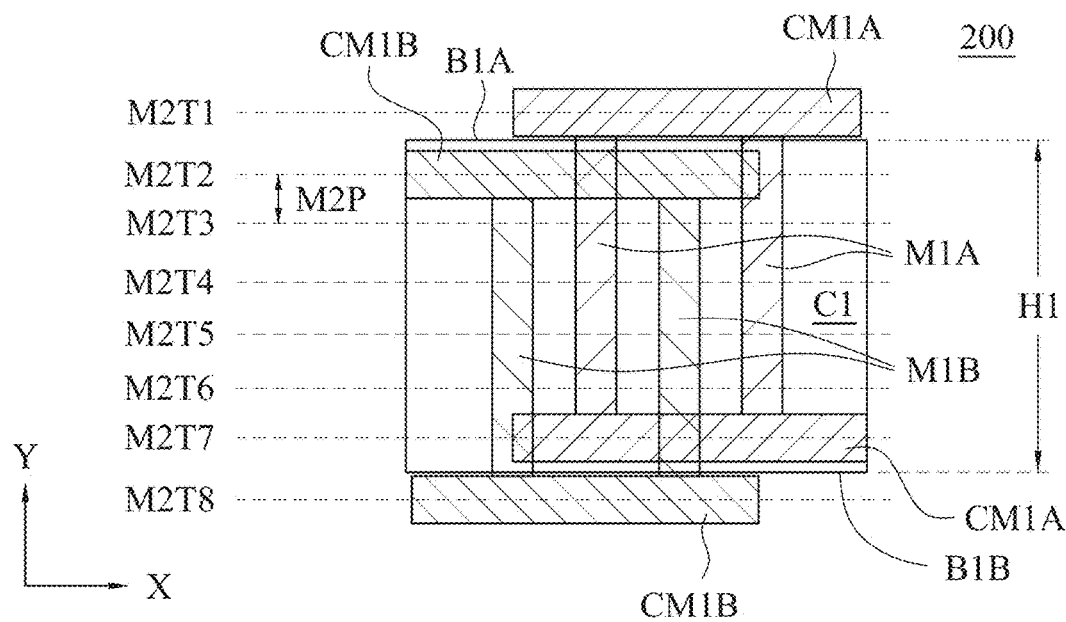

Positioning the one or more cells relative to the tracks includes orienting the height of the one or more cells along the pitch direction. In some embodiments, the height of the one or more cells is equal to a multiple of the pitch. In some embodiments, orienting the height of the one or more cells along the pitch direction includes orienting height H1 of cell C1 equal to six times second metal layer pitch M2P as depicted in FIG. 2B. In some embodiments, orienting the height of the one or more cells along the pitch direction includes orienting height H4 equal to eleven times second metal layer pitch M2P and to the sum of heights H2 of cell C3 (six times second metal layer pitch M2P) and H3 of cell C4 (five times second metal layer pitch M2P) as depicted in FIG. 3B.

In various embodiments, positioning the one or more cells relative to the tracks includes aligning at least one border segment of the one or more cells with a given track or at a predetermined location, e.g., a midpoint, between adjacent tracks. In some embodiments, positioning the one or more cells relative to tracks in the IC layout diagram includes one or both of aligning border segment B1A of cell C1 between metal two tracks M2T1 and M2T2, e.g., at the midpoint (not labeled), or aligning border segment B1B of cell C1 between second metal layer tracks M2T7 and M2T8, e.g., at the midpoint (not labeled), as depicted in FIG. 2B. In some embodiments, positioning the one or more cells relative to tracks in the IC layout diagram includes one or more of aligning border segment B3A of cell C3 with second metal layer track M2T1, aligning border segment B3B of cell C3 with second metal layer track M2T7, aligning border segment B4A of cell C4 with second metal layer track M2T7, or aligning border segment B4B of cell C4 with second metal layer track M2T12, as depicted in FIG. 3B.

In some embodiments, positioning the one or more cells in the IC layout diagram includes abutting a first cell of the one or more cells with a second cell of the one or more cells. Abutting the first cell with the second cell includes abutting a border segment of the first cell with a border segment of the second cell such that the heights of each of the cells align in the first metal layer direction. Each of the aligned cells includes border segments adjacent to the abutted border segments, and in various embodiments, aligning the heights of the cells in the metal one direction includes aligning one, both, or neither of the corresponding adjacent border segments in the first metal layer direction. In some embodiments, positioning the one or more cells in the IC layout diagram does not include abutting first and second cells, and the one or more cells are received in operation 110 including the first cell abutted with the second cell.

Figure 2C:
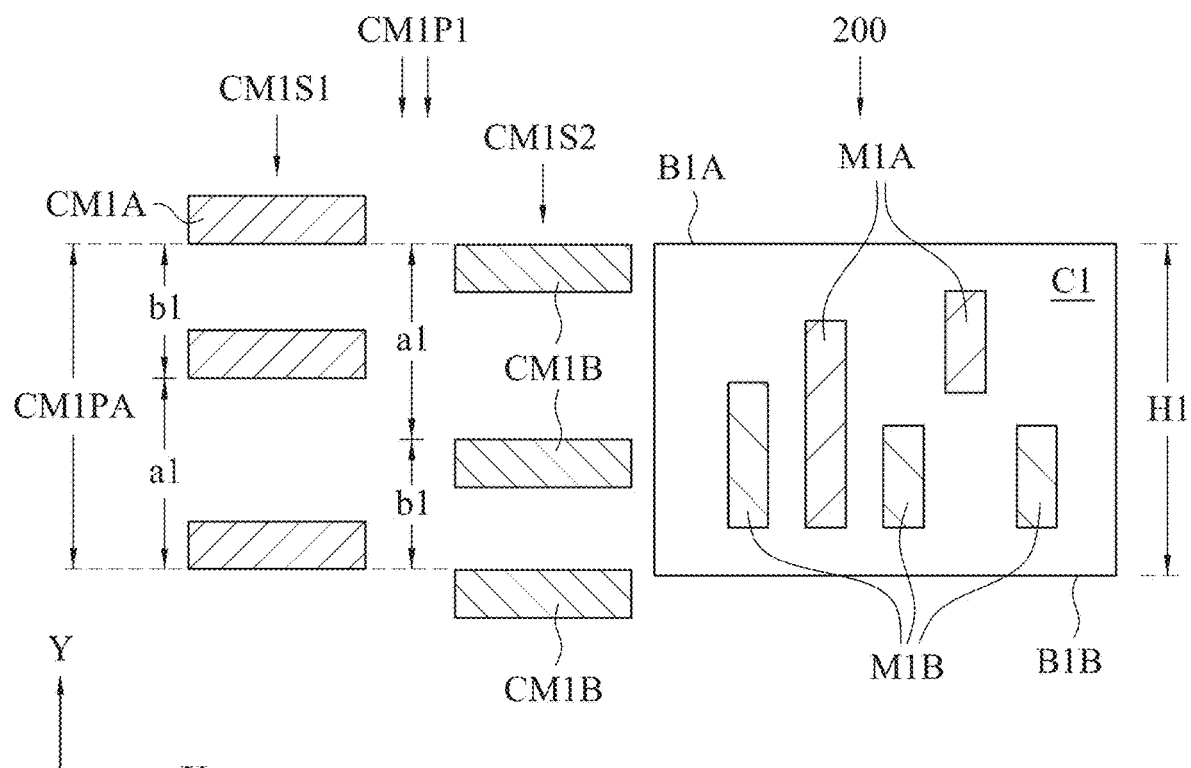
Figure 2D:
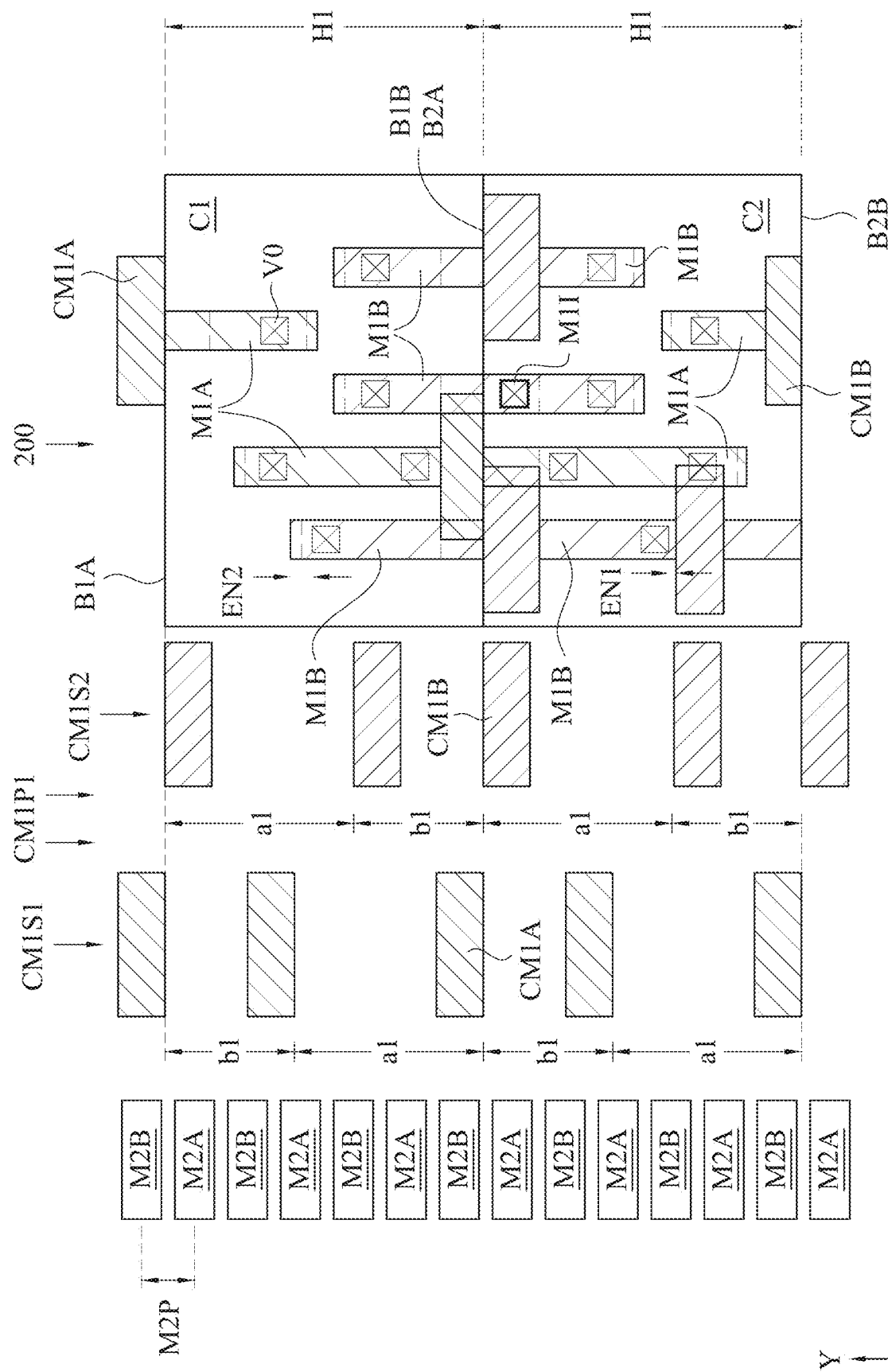
Figure 3C:
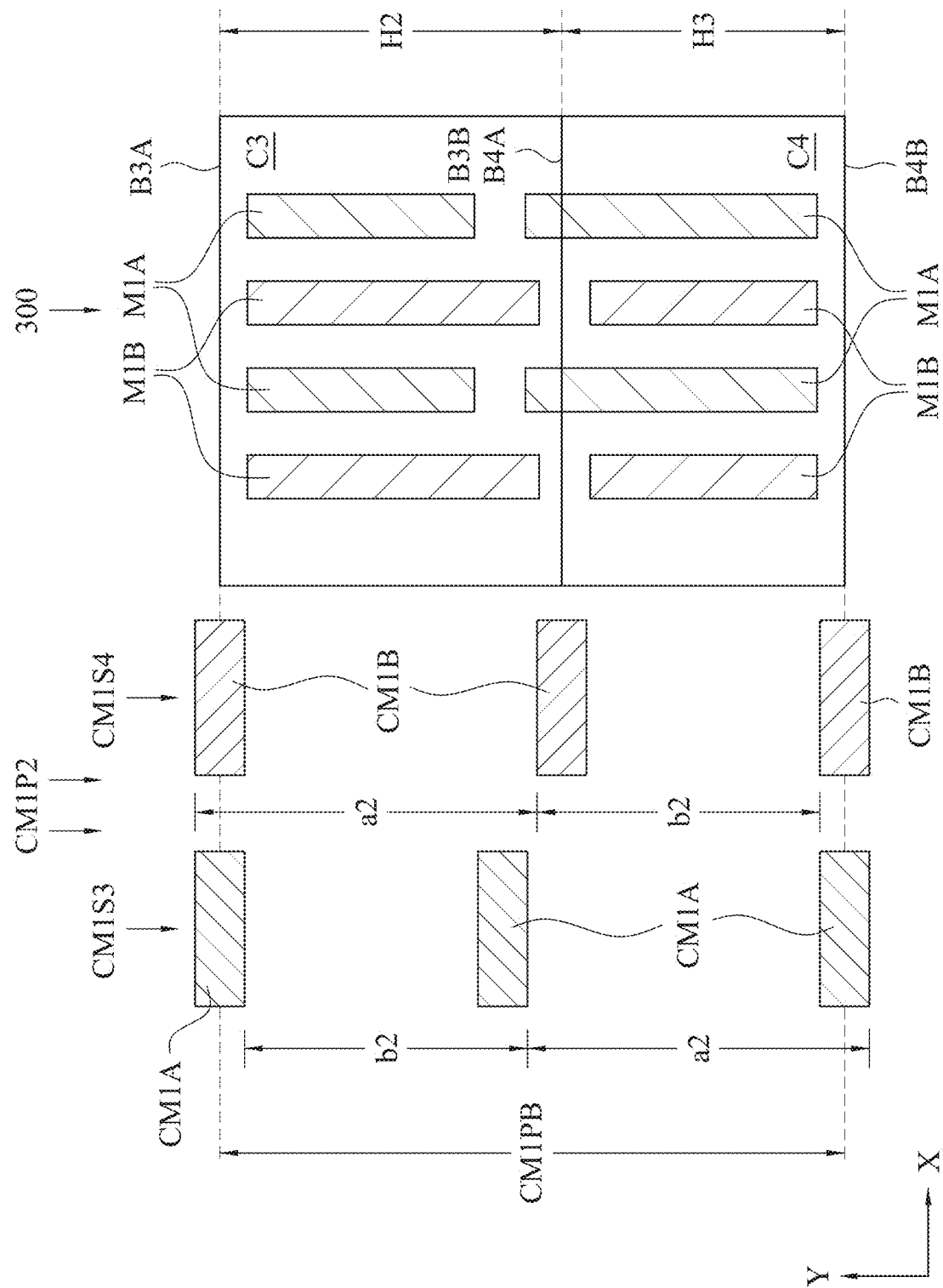
Figure 3D:
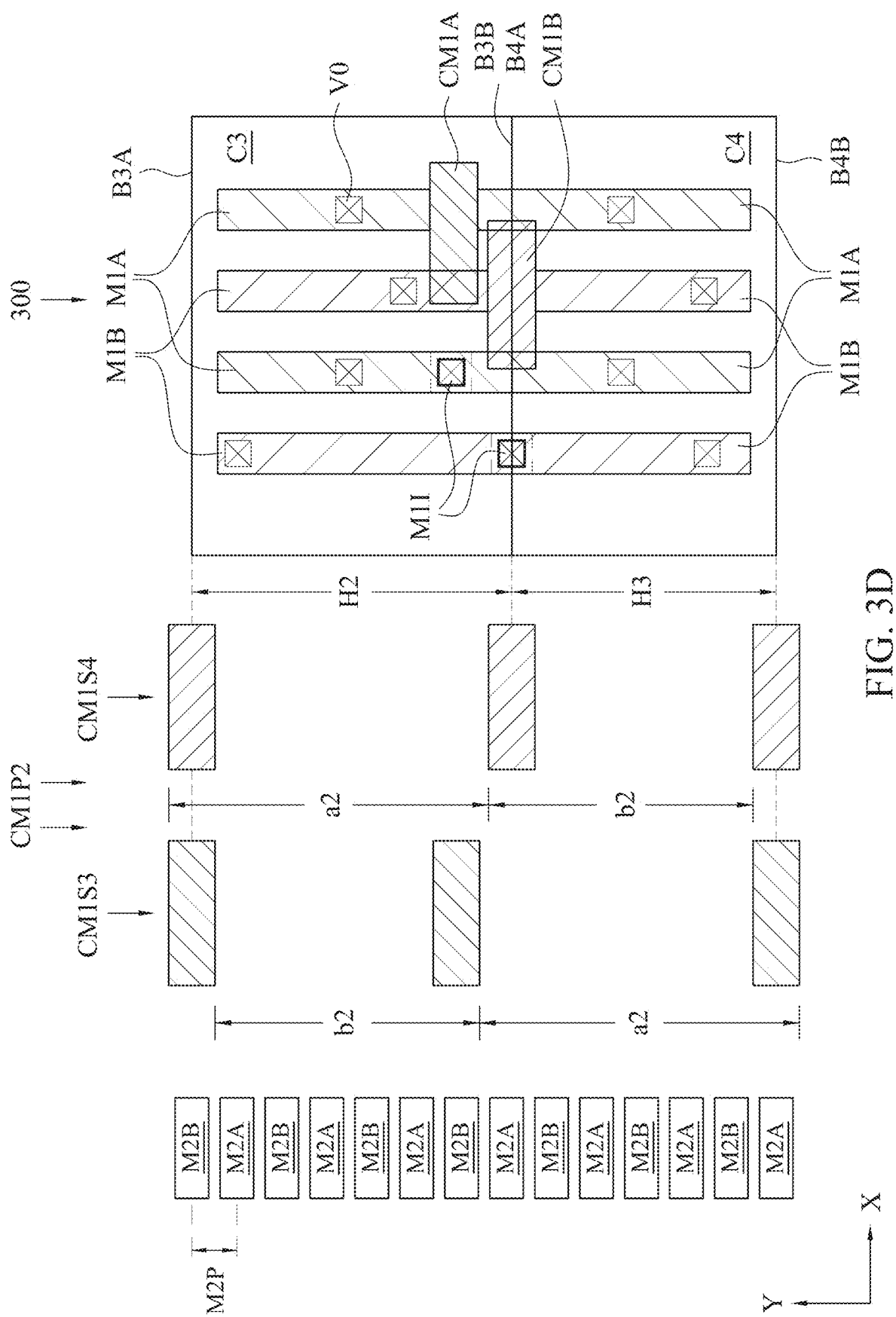

In some embodiments, abutting the first cell with the second cell includes abutting border segment B1B of cell C1 with border segment B2A of cell C2, as depicted in FIG. 2D. In some embodiments, abutting the first cell with the second cell includes abutting border segment B3B of cell C3 with border segment B4A of cell C4, as depicted in FIGS. 3B-3D.

Positioning the one or more cells in the IC layout diagram includes positioning the one or more cells relative to a first metal layer cut region alignment pattern. The first metal layer cut region alignment pattern is an arrangement of alignment locations along the first metal layer direction at which first metal layer cut regions are potentially positioned, the first metal layer cut region alignment pattern having a pattern pitch equal to the height of the one or more cells. In various embodiments, the first metal layer cut region alignment pattern includes a number of alignment locations ranging from two to six.

In some embodiments, the first metal layer cut region alignment pattern includes first and second sub-patterns corresponding to the respective first and second mask sets. In various embodiments, at least one alignment location of the first sub-pattern is the same as at least one alignment location of the second sub-pattern, or each alignment location of the first sub-pattern is different from each alignment location of the second sub-pattern.

In various embodiments, positioning the one or more cells relative to the first metal layer cut region alignment pattern includes positioning cell C1 relative to first metal layer cut regions CM1A and CM1B arranged as depicted in FIG. 2B, or positioning cells C3 and C4 relative to first metal layer cut regions CM1A and CM1B arranged as depicted in FIG. 3B. In each of the embodiments depicted in FIGS. 2B and 3B, first metal layer cut regions CM1A and first metal layer regions M1A correspond to the first mask set, and first metal layer cut regions CM1B and first metal layer regions M1B correspond to the second mask set. The arrangements depicted in FIGS. 2B and 3B are simplified for the purpose of illustration, e.g., by omitting one or more first metal layer cut regions and including first metal layer regions spanning entire distances between first metal layer cut regions.

In the embodiment depicted in FIG. 2B, a pair of first metal layer cut regions CM1A corresponds to a first sub-pattern (not labeled) centered on second metal layer tracks M2T1 and M2T7, and a pair of first metal layer cut regions CM1B corresponds to a second sub-pattern (not labeled) centered on second metal layer tracks M2T2 and M2T8. Each of the first and second sub-patterns thereby has a pattern pitch equal to height H1 of cell C1, also equal to six times second metal layer pitch M2P.

As illustrated in FIG. 2B, because the first and second sub-patterns correspond to separate mask sets, first metal layer cut regions CM1A define removed portions of first metal layer regions M1A independent of removed portions of first metal layer regions M1B, and first metal layer cut regions CM1B define removed portions of first metal layer regions M1B independent of removed portions of first metal layer regions M1A.

Positioning cell C1 relative to first metal layer cut regions CM1A and CM1B arranged as depicted in FIG. 2B is further depicted in FIG. 2C, in which IC layout diagram 200 includes cell C1 including two first metal layer regions M1A and three first metal layer regions M1B. FIG. 2C includes a first metal layer cut region alignment pattern CM1P1 having a pattern pitch CM1PA in the Y direction and including sub-patterns CM1S1 and CM1S2. Pattern pitch CM1PA is equal to height H1 of cell C1.

Sub-pattern CM1S1 includes first metal layer cut regions CM1A corresponding to the first mask set along with first metal layer regions M1A, and sub-pattern CM1S2 includes first metal layer cut regions CM1B corresponding to the second mask set along with first metal layer regions M1B.

Sub-pattern CM1S1 includes a first alignment location corresponding to border segment B1B, a second alignment location offset in the positive Y direction from the first alignment location by a distance a1, and a third alignment location offset in the positive Y direction from the second alignment location by a distance b1. The sum of distances a1 and b1 is equal to pattern pitch CM1PA such that the third alignment location corresponds to border segment B1A. With respect to the Y direction, a lowermost border segment of each first metal layer cut region CM1A is aligned with a corresponding one of the first, second, and third alignment locations.

Sub-pattern CM1S2 includes a first alignment location corresponding to border segment B1A, a second alignment location offset in the negative Y direction from the first alignment location by distance a1, and a third alignment location offset in the negative Y direction from the second alignment location by distance b1 and thereby corresponding to border segment B1B. With respect to the Y direction, an uppermost border segment of each first metal layer cut region CM1B is aligned with a corresponding one of the first, second, and third alignment locations.

By the configuration discussed above, sub-patterns CM1S1 and CM1S2 are symmetrical about an axis extending in the X direction. Each of sub-patterns CM1S1 and CM1S2 includes a pair of alignment locations corresponding to pattern pitch CM1PA and border segments B1A and B1B, and a third alignment location between the pair at a location corresponding to distances a1 and b1. In various embodiments, distance a1 is greater than, less than, or equal to distance b1.

Positioning cell C1 relative to first metal layer cut regions CM1A and CM1B arranged as depicted in FIGS. 2B and 2C is further depicted in FIG. 2D, in which IC layout diagram 200 includes cell C1 abutted with cell C2, each of cells C1 and C2 including two first metal layer regions M1A and three first metal layer regions M1B extending lengthwise and aligned in the Y direction.

In the embodiment depicted in FIG. 2D, compared to the embodiment depicted in FIG. 2C, each of sub-patterns CM1S1 and CM1S2 is repeated to correspond to abutted cells C1 and C2. Repeated sub-pattern CM1S1 includes a shared first metal layer cut region CM1A at a shared alignment location corresponding to abutted border segments B1B and B2A, and repeated sub-pattern CM1S2 includes a shared first metal layer cut region CM1B at a shared alignment location corresponding to abutted border segments B1B and B2A. As thereby illustrated in FIG. 2D, in some embodiments, positioning cell C1 relative to first metal layer cut regions CM1A and CM1B includes positioning abutted cells C1 and C2 relative to first metal layer cut region alignment pattern CM1P1 including repeated sub-patterns CM1S1 and CM1S2.

FIG. 2D further depicts second metal layer regions M2A and M2B having second metal layer pitch M2P discussed above. Second metal layer regions M2A correspond to the first mask set, second metal layer regions M2B correspond to the second mask set, and second metal layer regions M2A and M2B are positioned at alternating second metal layer tracks (not shown) corresponding to second metal layer pitch M2P. As thereby illustrated in FIG. 2D, in some embodiments, positioning cell C1 relative to first metal layer cut regions CM1A and CM1B includes positioning cell C1 relative to first metal layer cut region alignment pattern CM1P1 aligned with alternating second metal layer regions M2A and M2B.

FIG. 2D includes additional features discussed below with respect to operations 130 through 150.

In the embodiment depicted in FIG. 3B, a pair of first metal layer cut regions CM1A corresponds to a first sub-pattern (not labeled), a pair of first metal layer cut regions CM1B corresponds to a second sub-pattern (not labeled), and both pairs of first metal layer cut regions CM1A and CM1B are centered on second metal layer tracks M2T1 and M2T12. Each of the first and second sub-patterns thereby has a pattern pitch equal to height H4, the sum of height H2 of cell C3 and height H3 of cell C4, also equal to eleven times second metal layer pitch M2P.

Positioning cells C3 and C4 relative to first metal layer cut regions CM1A and CM1B arranged as depicted in FIG. 3B is further depicted in FIG. 3C, in which IC layout diagram 300 includes each of cells C3 and C4 including two first metal layer regions M1A and two first metal layer regions M1B extending lengthwise and aligned in the Y direction. Based on border segment B3B of cell C3 being abutted with border segment B4A of cell C4, the two first metal layer regions M1A of cell C4 extend into cell C3. FIG. 3C includes a first metal layer cut region alignment pattern CM1P2 having a pattern pitch CM1PB in the Y direction and including sub-patterns CM1S3 and CM1S4. Pattern pitch CM1PB is equal to height H4 (not labeled in FIG. 3C), the sum of height H2 of cell C3 and height H3 of cell C4.

Sub-pattern CM1S3 includes first metal layer cut regions CM1A corresponding to the first mask set along with first metal layer regions M1A, and sub-pattern CM1S4 includes first metal layer cut regions CM1B corresponding to the second mask set along with first metal layer regions M1B.

Sub-pattern CM1S3 includes a first alignment location offset in the negative Y direction from border segment B4B, a second alignment location offset in the positive Y direction from the first alignment location by a distance a2, and a third alignment location offset in the positive Y direction from the second alignment location by a distance b2. The sum of distances a2 and b2 is equal to pattern pitch CM1PB such that the third alignment location corresponds to an offset in the negative Y direction from border segment B3A equivalent to the offset of the first alignment location from border segment B4B. With respect to the Y direction, a lowermost border segment of each first metal layer cut region CM1A is aligned with a corresponding one of the first, second, and third alignment locations.

Sub-pattern CM1S4 includes a first alignment location offset in the positive Y direction from border segment B3A, a second alignment location offset in the negative Y direction from the first alignment location by distance a2, and a third alignment location offset in the negative Y direction from the second alignment location by distance b2 and thereby corresponding to an offset in the positive Y direction from border segment B4B equivalent to the offset of the first alignment location from border segment B3A. With respect to the Y direction, an uppermost border segment of each first metal layer cut region CM1B is aligned with a corresponding one of the first, second, and third alignment locations.

By the configuration discussed above, sub-patterns CM1S3 and CM1S4 are symmetrical about an axis extending in the X direction. Each of sub-patterns CM1S3 and CM1S4 includes a pair of alignment locations corresponding to pattern pitch CM1PB and border segments B3A and B4B, and a third alignment location between the pair at a location corresponding to distances a2 and b2. In various embodiments, distance a2 is greater or less than distance b2.

Positioning cells C3 and C4 relative to first metal layer cut regions CM1A and CM1B arranged as depicted in FIGS. 3B and 3C is further depicted in FIG. 3D, which includes alternating second metal layer regions M2A and M2B having second metal layer pitch M2P, as discussed above. As thereby illustrated in FIG. 3D, in some embodiments, positioning cells C3 and C4 relative to first metal layer cut regions CM1A and CM1B includes positioning cells C3 and C4 relative to first metal layer cut region alignment pattern CM1P2 aligned with alternating second metal layer regions M2A and M2B.

FIG. 3D includes additional features discussed below with respect to operations 130 through 150.

At operation 130, the one or more cells are overlapped with a first metal layer cut region based on the first metal layer cut region alignment pattern. Overlapping the one or more cells with the first metal layer cut region includes positioning the first metal layer cut region at an alignment location of the first metal layer cut region alignment pattern. In various embodiments, overlapping the one or more cells with the first metal layer cut region includes overlapping the one or more cells with one or more first metal layer cut regions corresponding to all or a subset of the alignment locations included in the first metal layer cut region alignment pattern.

Overlapping the one or more cells with the first metal layer cut region includes the first metal layer cut region extending lengthwise in the direction perpendicular to the first metal layer direction. In various embodiments, overlapping the one or more cells with the first metal layer cut region includes the first metal layer cut region extending lengthwise across a single first metal layer region or across more than one first metal layer region.

In various embodiments in which the first metal layer cut region alignment pattern includes first and second sub-patterns corresponding to first and second mask sets, overlapping the one or more cells with the first metal layer cut region includes overlapping the one or more cells with a single first metal layer cut region corresponding to one of the sub-patterns, with more than one first metal layer cut region corresponding to one of the sub-patterns, or to at least one first metal layer cut region corresponding to each of the sub-patterns.

In some embodiments, overlapping the one or more cells with the first metal layer cut region includes overlapping cell C1 and/or cell C2 with one or more of first metal layer cut regions CM1A or CM1B (not labeled in FIG. 2D) as depicted in FIG. 2D. In FIG. 2D, IC layout diagram 200 includes cell C1 overlapped by a first metal layer cut region CM1A along border segment B1B and positioned at the shared alignment location of repeated sub-pattern CM1S1.

As further depicted in FIG. 2D, IC layout diagram 200 includes cell C2 overlapped by first metal layer cut region CM1A along border segment B2B and positioned at the lowermost alignment location of sub-pattern CM1S1, and overlapped by first metal layer cut regions CM1B along border segment B2A and positioned at the shared alignment location of repeated sub-pattern CM1S2.

As depicted in FIG. 2D, IC layout diagram 200 includes cell C2 overlapped by a first metal layer cut region CM1B positioned at an alignment location of sub-pattern CM1S2 offset in the negative Y direction from the shared alignment location by distance a1, thereby defining a distance EN1 between the first metal layer cut region CM1B and an adjacent metal zero via region V0.

Distance EN1 is a non-limiting example of a minimum metal zero via enclosure rule, referred to as a first metal layer NOT first metal layer cut enclosure via rule in some embodiments. In some embodiments, a manufacturing process is capable of removing a portion of a first metal layer segment with an improved tolerance relative to a metal zero via compared to a tolerance applicable when defining the first metal layer segment relative to a metal zero via. Accordingly, because distance EN1 is defined by a metal cut region, e.g., first metal layer cut region CM1B, and not by a border segment of a first metal layer region, e.g., first metal layer region M1B, distance EN1 is capable of having a value less than a value of a minimum metal zero via enclosure rule based on a border segment of a first metal layer region, e.g., a distance EN2 discussed below with respect to operation 140.

IC layout diagram 200 also includes a first metal layer cut region CM1A positioned outside of cell C1 along border segment B1A and positioned at the uppermost alignment location of sub-pattern CM1S1, thereby illustrating an embodiment in which overlapping the one or more cells with the first metal layer cut region includes overlapping a portion of the IC layout diagram adjacent to the one or more cells. In some embodiments, by overlapping a portion of the IC layout diagram adjacent to a cell with a first metal layer cut region, a first metal layer region in the cell is capable of being extended to the corresponding border segment of the cell, as discussed below with respect to operation 140.

In some embodiments, overlapping the one or more cells with the first metal layer cut region includes overlapping cells C3 and C4 with one or more of first metal layer cut regions CM1A or CM1B as depicted in FIG. 3D. In FIG. 3D, IC layout diagram 300 includes cell C3 overlapped by a first metal layer cut region CM1A positioned at the alignment location offset in the positive Y direction from the lowermost alignment location of sub-pattern CM1S3 by distance A2.

As further depicted in FIG. 3D, IC layout diagram 300 includes both of cells C3 and C4 overlapped by first metal layer cut region CM1B along abutted border segments B3B and B4A, and positioned at the alignment location offset in the negative Y direction from the uppermost alignment location of sub-pattern CM1S4 by distance a2.

At operation 140, in some embodiments, a first metal layer region of the one or more cells is extended. Extending the first metal layer region includes extending each of one or more first metal layer regions lengthwise along the first metal layer direction in one or both polarities of the first metal layer direction. In various embodiments, extending the first metal layer region of the one or more cells includes extending the first metal layer region within a border of a single cell, up to one or more border segments of a single cell, or across one or more border segments of a first cell into one or more second cells, e.g., as part of connecting the first metal layer regions of adjacent cells.

In some embodiments, extending the first metal layer region includes extending the first metal layer region beyond a metal zero via region by an amount sufficient to pass a metal zero via enclosure rule.

In various embodiments in which the first metal layer regions correspond to first and second mask sets, extending the first metal layer region includes extending a single first metal layer region corresponding to one of the sub-patterns, more than one first metal layer region corresponding to one of the sub-patterns, or at least one first metal layer region corresponding to each of the sub-patterns.

In various embodiments, extending the first metal layer region of the one or more cells includes extending one or more of first metal layer regions M1A and/or M1B of one or both of cells C1 or C2 as depicted in FIG. 2D or cells C3 or C4 as depicted in FIG. 3D, in which extended portions of first metal layer regions M1A and M1B correspond to dashed lines extending in the X direction.

In the embodiment depicted in FIG. 2D, extending the first metal layer region of the one or more cells includes, e.g., extending all but one of first metal layer regions M1A and M1B beyond corresponding metal zero via regions V0 by an amount sufficient to pass a metal zero via enclosure rule, as indicated by distance EN2.

In various embodiments, extending the first metal layer region includes extending a first metal layer region M1A of cell C1 to border segment B1A corresponding to first metal layer cut region CM1A adjacent to cell C1, and/or extending a first metal layer region M1A of cell C2 to border segment B2A. In each case, the first metal layer region M1A is capable of being extended based on an adjacent first metal layer cut region CM1A ensuring that a minimum spacing rule between adjacent first metal layer regions is met.

Similarly, in some embodiments, extending the first metal layer region includes extending at least one first metal layer region M1B of cell C1 to border segment B1B corresponding to a corresponding first metal layer cut region CM1B adjacent to cell C1. In some embodiments, extending the first metal layer region includes connecting a first metal layer region M1B of cell C1 with a corresponding first metal layer region of cell C2 across abutted border segments B1B and B2A.

In the embodiment depicted in FIG. 3D, extending the first metal layer region of the one or more cells includes, e.g., connecting a first metal layer region M1A of cell C3 with a corresponding first metal layer region M1A of cell C4 and/or connecting a first metal layer region M1B of cell C3 with the corresponding first metal layer region M1B of cell C4 across abutted border segments B3B and B4A.

By being extended to or across the corresponding border segment, a first metal layer region M1A or M1B is capable of defining a portion of an electrical connection to an overlying metal interconnect feature, e.g., a first metal layer interconnect structure M1I discussed below with respect to operation 150.

In various embodiments, based on the alignment locations of a first metal layer cut region pattern, e.g., first metal layer cut region pattern CM1P1 or CM1P2, and the positioning of the one or more cells, e.g., cells C1 and/or C2 or C3 and C4, relative to second metal layer regions M2A and M2B, an electrical connection to a first metal layer segment defined by an extended first metal layer region M1A includes a second metal layer segment defined by a second metal layer region M2A, and/or an electrical connection to a first metal layer segment defined by an extended first metal layer region M1B includes a second metal layer segment defined by a second metal layer region M2B.

At operation 150, in some embodiments, an extended portion of a first metal layer region of the one or more cells is overlapped with a first metal layer interconnect feature. In some embodiments, overlapping the first metal layer region includes overlapping the first metal layer region with a first metal layer via region. In some embodiments, overlapping the extended portion of the first metal layer region includes overlapping each of more than one first metal layer regions with a corresponding first metal layer interconnect feature.

In various embodiments in which the first metal layer regions correspond to first and second mask sets, overlapping the extended portion of the first metal layer region includes overlapping a single first metal layer region corresponding to one of the sub-patterns, more than one first metal layer region corresponding to one of the sub-patterns, or at least one first metal layer region corresponding to each of the sub-patterns.

In various embodiments, overlapping the extended portion of the first metal layer region includes overlapping at least one of first metal layer regions M1A or M1B with first metal layer interconnect feature M1I, also referred to as a first metal layer via region in some embodiments, as depicted in each of FIGS. 2D and 3D.

In various embodiments, some or all of operations 110 through 150 are capable of being performed as part of an automated placement and routing (APR) method performed by an APR system. In various embodiments, an APR method includes one or a combination of a constructive algorithm, an iterative algorithm, or an integrated algorithm.

In a constructive algorithm, operations of placing and routing are performed on a cell-by-cell basis. After an IC layout diagram has been updated to include placement of a given cell and its associated routing connections, an additional layout diagram revision includes placement of an additional cell and its associated routing connections.

In an iterative algorithm, an initial IC layout diagram including multiple cells and associated routing connections is iteratively analyzed and revised based on circuit performance and trade-off criteria.

In an integrated algorithm, circuit performance and trade-off criteria are applied as an IC layout diagram is being revised to include placement of a given cell and/or its routing connections.

At operation 160, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes using IC device design system 400, discussed below with respect to FIG. 4.

At operation 170, in some embodiments, one or more manufacturing operations are performed based on the IC layout diagram. In various embodiments, performing the one or more manufacturing operations includes one or more of fabricating one or more semiconductor masks or at least one component in a layer of a semiconductor IC, or performing one or more lithographic exposures based on the IC layout diagram as part of an IC manufacturing flow discussed below with respect to IC manufacturing system 500 and FIG. 5.

By executing some or all of the operations of method 100, manufacturing system operations include generating an IC layout diagram by applying a first metal layer cut region alignment pattern to one or more cells as part of positioning the one or more cells in the IC layout diagram. By overlapping the one or more cells with at least one first metal layer cut region based on the first metal layer cut region alignment pattern, electrical interconnect routing flexibility is improved compared to approaches that do not include applying a first metal layer cut region alignment pattern to one or more cells positioned within an IC layout diagram, e.g., approaches in which first metal layer cut regions are defined at the cell level.

In various embodiments, the improved electrical interconnect routing flexibility based on the first metal layer cut region alignment pattern is enabled by applying a minimum metal zero via enclosure rule based on an applied first metal layer cut region discussed with respect to operation 130, extending a first metal layer region adjacent to a metal zero via region discussed with respect to operation 140, and/or overlapping an extending first metal layer region with a first metal layer interconnect feature discussed with respect to operations 140 and 150.

Figure 4:
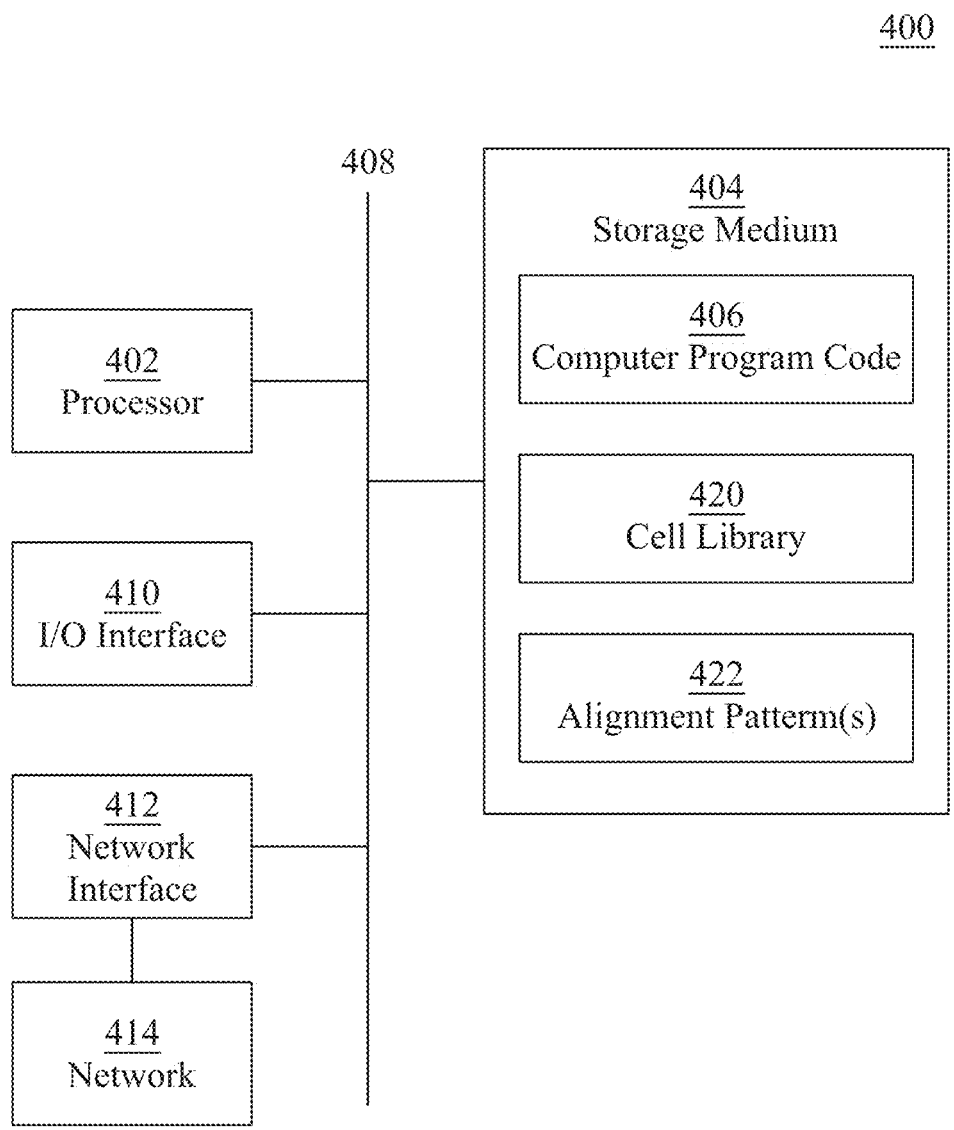
FIG. 4 is a block diagram of an IC device design system, in accordance with some embodiments.

FIG. 4 is a block diagram of IC device design system 400, in accordance with some embodiments. One or more operations of method 100, discussed above with respect to FIGS. 1-3C, are implementable using IC device design system 400, in accordance with some embodiments. In various embodiments, IC device design system 400 is some or all of an EDA system, e.g., an APR design system.

In some embodiments, IC device design system 400 is a computing device including a processor 402 and a non-transitory computer-readable storage medium 404. Non-transitory computer-readable storage medium 404, amongst other things, is encoded with, i.e., stores, computer program code 406, i.e., a set of executable instructions. Execution of instructions 406 by processor 402 represents (at least in part) an IC device design system which implements a portion or all of a method, e.g., a method 100 discussed above with respect to FIGS. 1-3C (hereinafter, the noted processes and/or methods).

Processor 402 is electrically coupled to non-transitory computer-readable storage medium 404 via a bus 408. Processor 402 is also electrically coupled to an I/O interface 410 by bus 408. A network interface 412 is also electrically connected to processor 402 via bus 408. Network interface 412 is connected to a network 414, so that processor 402 and non-transitory, computer-readable storage medium 404 are capable of connecting to external elements via network 414. Processor 402 is configured to execute computer program code 406 encoded in non-transitory computer-readable storage medium 404 in order to cause IC device design system 400 to be usable for performing a portion or all of the noted processes and/or methods. In one or more embodiments, processor 402 is a central processing unit (CPU), a multi-processor, a distributed processing system, an application specific integrated circuit (ASIC), and/or a suitable processing unit.

In one or more embodiments, non-transitory computer-readable storage medium 404 is an electronic, magnetic, optical, electromagnetic, infrared, and/or a semiconductor system (or apparatus or device). For example, non-transitory computer-readable storage medium 404 includes a semiconductor or solid-state memory, a magnetic tape, a removable computer diskette, a random access memory (RAM), a read-only memory (ROM), a rigid magnetic disk, and/or an optical disk. In one or more embodiments using optical disks, non-transitory computer-readable storage medium 404 includes a compact disk-read only memory (CD-ROM), a compact disk-read/write (CD-R/W), and/or a digital video disc (DVD).

In one or more embodiments, non-transitory computer-readable storage medium 404 stores computer program code 406 configured to cause IC device design system 400 to be usable for performing a portion or all of the noted processes and/or methods. In one or more embodiments, non-transitory computer-readable storage medium 404 also stores information which facilitates performing a portion or all of the noted processes and/or methods. In various embodiments, non-transitory computer-readable storage medium 404 stores one or a portion of a cell library 420 and/or one or a combination of at least one alignment pattern 422, discussed above with respect to method 100 and FIGS. 1-3C.

IC device design system 400 includes I/O interface 410. I/O interface 410 is coupled to external circuitry. In various embodiments, I/O interface 410 includes one or a combination of a keyboard, keypad, mouse, trackball, trackpad, display, touchscreen, and/or cursor direction keys for communicating information and commands to and/or from processor 402.

IC device design system 400 also includes network interface 412 coupled to processor 402. Network interface 412 allows system 400 to communicate with network 414, to which one or more other computer systems are connected. Network interface 412 includes wireless network interfaces such as BLUETOOTH, WIFI, WIMAX, GPRS, or WCDMA; or wired network interfaces such as ETHERNET, USB, or IEEE-1364. In one or more embodiments, a portion or all of the noted processes and/or methods, is implemented in two or more systems 400.

IC device design system 400 is configured to receive information through I/O interface 410. The information received through I/O interface 410 includes one or a combination of at least one IC layout diagram, at least one alignment pattern, and/or other parameters for processing by processor 402. The information is transferred to processor 402 via bus 408. IC device design system 400 is configured to transmit and/or receive information related to a user interface through I/O interface 410.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, an IC layout diagram is generated using a tool such as VIRTUOSO® available from CADENCE DESIGN SYSTEMS, Inc., or another suitable layout generating tool.

In some embodiments, the processes are realized as functions of a program stored in a non-transitory computer-readable recording medium. Examples of a non-transitory computer-readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

By being usable to implement one or more operations of method 100, as discussed above with respect to FIGS. 1-3C, IC device design system 400 and a non-transitory computer-readable storage medium, e.g., non-transitory computer-readable storage medium 404, enable the benefits discussed above with respect to method 100.

Figure 5:
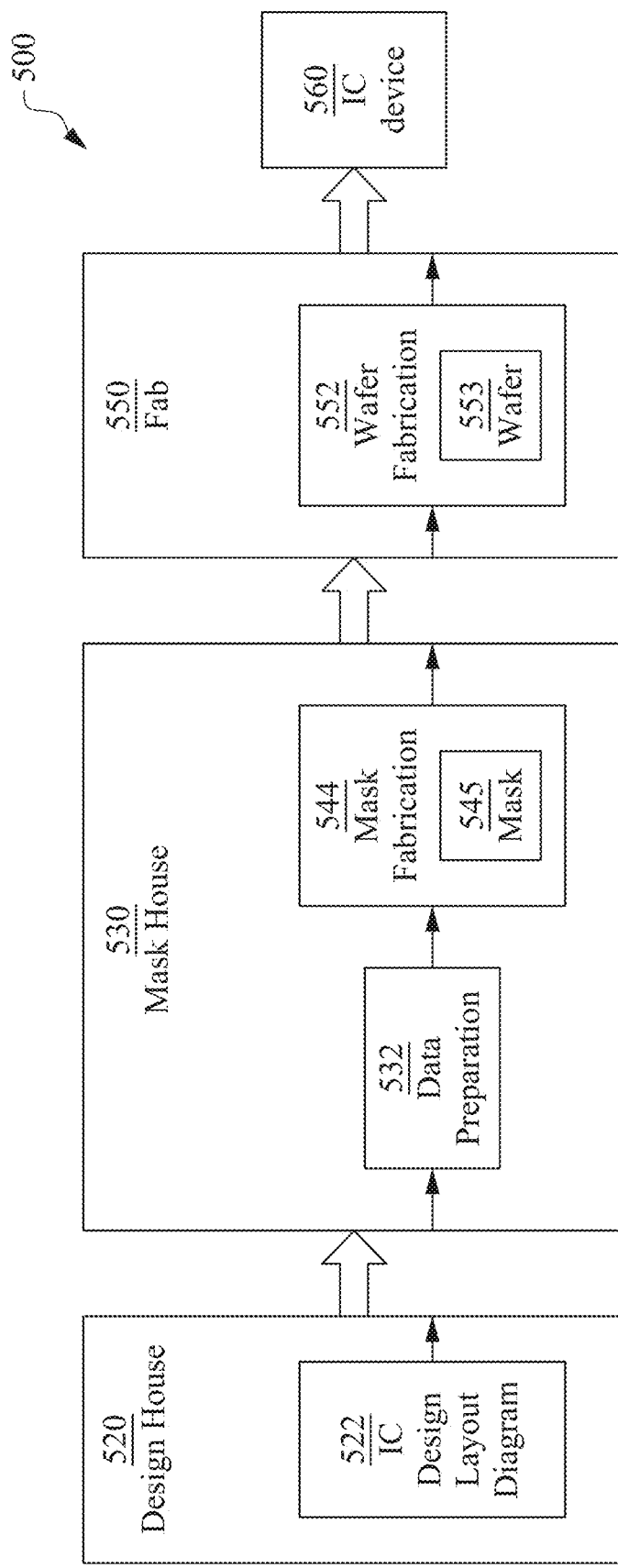
FIG. 5 is a block diagram of an IC manufacturing system, and an IC manufacturing flow associated therewith, in accordance with some embodiments.

FIG. 5 is a block diagram of IC manufacturing system 500, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 500.

In FIG. 5, IC manufacturing system 500 includes entities, such as a design house 520, a mask house 530, and an IC manufacturer/fabricator ("fab") 550, that interact with one another in the design, development, and manufacturing cycles and/or services related to manufacturing an IC device 560. The entities in system 500 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 520, mask house 530, and IC fab 550 is owned by a single larger company. In some embodiments, two or more of design house 520, mask house 530, and IC fab 550 coexist in a common facility and use common resources.

Design house (or design team) 520 generates an IC design layout diagram 522 based on method 100, discussed above with respect to FIGS. 1-3C. IC design layout diagram 522 includes various geometrical patterns that correspond to patterns of metal, oxide, or semiconductor layers that make up the various components of IC device 560 to be fabricated. The various layers combine to form various IC features. For example, a portion of IC design layout diagram 522 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 520 implements a proper design procedure including one or more operations of method 100, discussed above with respect to FIGS. 1-3C, to form IC design layout diagram 522. The design procedure includes one or more of logic design, physical design or place and route. IC design layout diagram 522 is presented in one or more data files having information of the geometrical patterns. For example, IC design layout diagram 522 can be expressed in a GDSII file format or DFII file format.

Mask house 530 includes data preparation 532 and mask fabrication 544. Mask house 530 uses IC design layout diagram 522 to manufacture one or more masks 545 to be used for fabricating the various layers of IC device 560 according to IC design layout diagram 522. Mask house 530 performs mask data preparation 532, where IC design layout diagram 522 is translated into a representative data file ("RDF"). Mask data preparation 532 provides the RDF to mask fabrication 544. Mask fabrication 544 includes a mask writer. A mask writer converts the RDF to an image on a substrate, such as a mask (reticle) 545 or a semiconductor wafer 553. The design layout diagram 522 is manipulated by mask data preparation 532 to comply with particular characteristics of the mask writer and/or requirements of IC fab 550. In FIG. 5, mask data preparation 532 and mask fabrication 544 are illustrated as separate elements. In some embodiments, mask data preparation 532 and mask fabrication 544 can be collectively referred to as mask data preparation.

In some embodiments, mask data preparation 532 includes optical proximity correction (OPC) which uses lithography enhancement techniques to compensate for image errors, such as those that can arise from diffraction, interference, other process effects and the like. OPC adjusts IC design layout diagram 522. In some embodiments, mask data preparation 532 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 532 includes a mask rule checker (MRC) that checks the IC design layout diagram 522 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 522 to compensate for limitations during mask fabrication 544, which may undo part of the modifications performed by OPC in order to meet mask creation rules.

In some embodiments, mask data preparation 532 includes lithography process checking (LPC) that simulates processing that will be implemented by IC fab 550 to fabricate IC device 560. LPC simulates this processing based on IC design layout diagram 522 to create a simulated manufactured device, such as IC device 560. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 522.

It should be understood that the above description of mask data preparation 532 has been simplified for the purposes of clarity. In some embodiments, data preparation 532 includes additional features such as a logic operation (LOP) to modify the IC design layout diagram 522 according to manufacturing rules. Additionally, the processes applied to IC design layout diagram 522 during data preparation 532 may be executed in a variety of different orders.

After mask data preparation 532 and during mask fabrication 544, a mask 545 or a group of masks 545 are fabricated based on the modified IC design layout diagram 522. In some embodiments, mask fabrication 544 includes performing one or more lithographic exposures based on IC design layout diagram 522. In some embodiments, an electron-beam (e-beam) or a mechanism of multiple e-beams is used to form a pattern on a mask (photomask or reticle) 545 based on the modified IC design layout diagram 522. Mask 545 can be formed in various technologies. In some embodiments, mask 545 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 545 includes a transparent substrate (e.g., fused quartz) and an opaque material (e.g., chromium) coated in the opaque regions of the binary mask. In another example, mask 545 is formed using a phase shift technology. In a phase shift mask (PSM) version of mask 545, various features in the pattern formed on the phase shift mask are configured to have proper phase difference to enhance the resolution and imaging quality. In various examples, the phase shift mask can be attenuated PSM or alternating PSM. The mask(s) generated by mask fabrication 544 is used in a variety of processes. For example, such a mask(s) is used in an ion implantation process to form various doped regions in semiconductor wafer 553, in an etching process to form various etching regions in semiconductor wafer 553, and/or in other suitable processes.

IC fab 550 includes wafer fabrication 552. IC fab 550 is an IC fabrication business that includes one or more manufacturing facilities for the fabrication of a variety of different IC products. In some embodiments, IC Fab 550 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 550 uses mask(s) 545 fabricated by mask house 530 to fabricate IC device 560. Thus, IC fab 550 at least indirectly uses IC design layout diagram 522 to fabricate IC device 560. In some embodiments, semiconductor wafer 553 is fabricated by IC fab 550 using mask(s) 545 to form IC device 560. In some embodiments, the IC fabrication includes performing one or more lithographic exposures based at least indirectly on IC design layout diagram 522. Semiconductor wafer 553 includes a silicon substrate or other proper substrate having material layers formed thereon. Semiconductor wafer 553 further includes one or more of various doped regions, dielectric features, multi-level interconnects, and the like (formed at subsequent manufacturing steps).

Details regarding an IC manufacturing system (e.g., system 500 of FIG. 5), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method of generating an IC layout diagram includes positioning one or more cells in an IC layout diagram and overlapping the one or more cells with a first metal layer cut region based on a first metal layer cut region alignment pattern. The first metal layer cut region alignment pattern includes a pattern pitch equal to a height of the one or more cells. In some embodiments, the method includes receiving the one or more cells from a cell library. In some embodiments, the height of the one or more cells is a height of a single cell of the one or more cells. In some embodiments, the one or more cells in the IC layout diagram includes a first cell of the one or more cells abutted with a second cell of the one or more cells, the first cell of the one or more cells has a first cell height different from a second cell height of the second cell of the one or more cells, and the height of the one or more cells is equal to a sum of the first cell height and the second cell height. In some embodiments, the first metal layer cut region alignment pattern includes a first sub-pattern and a second sub-pattern, each of the first sub-pattern and the second sub-pattern includes first and second alignment locations separated by a first distance equal to the pattern pitch, and a third alignment location between the first and second alignment locations, and the first and second sub-patterns are symmetrical about an axis perpendicular to a direction corresponding to the height of the one or more cells. In some embodiments, the first sub-pattern corresponds to a first mask set and the second sub-pattern corresponds to a second mask set. In some embodiments, the first and third alignment locations are separated by a second distance different from a third distance separating the second and third alignment locations. In some embodiments, overlapping the one or more cells with the first metal layer cut region based on the first metal layer cut region alignment pattern includes positioning the first metal layer cut region alignment pattern based on a plurality of second metal layer tracks. In some embodiments, the method includes extending a first metal layer region of the one or more cells to or across a border segment of the one or more cells. In some embodiments, the method includes overlapping an extended portion of the first metal layer region of the one or more cells with a first metal layer interconnect feature.

In some embodiments, a method of generating an IC layout diagram includes abutting a first cell with a second cell in an IC layout diagram, positioning the first and second cells relative to a first metal layer cut region alignment pattern, and overlapping at least one of the first or second cells with a first metal layer cut region based on the first metal layer cut region alignment pattern. In some embodiments, the first metal layer cut region alignment pattern includes a pattern pitch equal to a height of each of the first and second cells. In some embodiments, the first cell has a first cell height different from a second cell height of the second cell, and the first metal layer cut region alignment pattern includes a pattern pitch equal to a sum of the first cell height and the second cell height. In some embodiments, the first metal layer cut region alignment pattern includes a first sub-pattern corresponding to a first mask set and a second sub-pattern corresponding to a second mask set different from the first mask set. In some embodiments, positioning the first and second cells relative to the first metal layer cut region alignment pattern includes aligning a border segment of one of the first or second cells between two second metal layer tracks, positioning an alignment location of the first sub-pattern along one second metal layer track, and positioning an alignment location of the second sub-pattern along the other second metal layer track. In some embodiments, positioning the first and second cells relative to the first metal layer cut region alignment pattern includes aligning a border segment of one of the first or second cells with a second metal layer track, and positioning an alignment location of each of the first and second sub-patterns along the second metal layer track. In some embodiments, the method includes, based on the IC layout diagram, at least one of fabricating at least one of one or more semiconductor masks, or at least one component in a layer of a semiconductor IC, or performing one or more lithographic exposures.

In some embodiments, an IC layout diagram generation system includes a processor and a non-transitory, computer readable storage medium including computer program code for one or more programs. The non-transitory, computer readable storage medium and the computer program code are configured to, with the processor, cause the system to receive a cell from a cell library, the cell being free from including a first metal layer cut region, align a border segment of the cell at a predetermined location between adjacent second metal layer tracks, position the cell relative to a first metal layer cut region alignment pattern positioned based on the second metal layer tracks, overlap the cell with a first metal layer cut region based on the first metal layer cut region alignment pattern, and generate an IC layout diagram of an IC device based on the cell and the first metal layer cut region. In some embodiments, the second metal layer tracks have a second metal layer pitch, and the cell has a cell height equal to a multiple of the second metal layer pitch. In some embodiments, the non-transitory, computer readable storage medium and the computer program code are configured to, with the processor, further cause the system to extend a first metal layer region of the cell with an extended portion reaching the border segment, and include the extended portion in a definition of an electrical connection to a first metal layer segment defined by the first metal layer region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating an integrated circuit (IC) layout diagram, the method comprising:
   positioning one or more cells in the IC layout diagram; and
   overlapping the one or more cells with a first metal layer cut region based on a first metal layer cut region alignment pattern,
   wherein the first metal layer cut region alignment pattern comprises a pattern pitch equal to a height of the one or more cells.

2. The method of claim 1, further comprising receiving the one or more cells from a cell library.

3. The method of claim 1, wherein the height of the one or more cells is a height of a single cell of the one or more cells.

4. The method of claim 1, wherein
   the one or more cells in the IC layout diagram comprises a first cell of the one or more cells abutted with a second cell of the one or more cells,
   the first cell of the one or more cells has a first cell height different from a second cell height of the second cell of the one or more cells, and
   the height of the one or more cells is equal to a sum of the first cell height and the second cell height.

5. The method of claim 1, wherein
   the first metal layer cut region alignment pattern comprises a first sub-pattern and a second sub-pattern,
   each of the first sub-pattern and the second sub-pattern comprises first and second alignment locations separated by a first distance equal to the pattern pitch, and a third alignment location between the first and second alignment locations, and
   the first and second sub-patterns are symmetrical about an axis perpendicular to a direction corresponding to the height of the one or more cells.

6. The method of claim 5, wherein the first sub-pattern corresponds to a first mask set and the second sub-pattern corresponds to a second mask set.

7. The method of claim 5, wherein the first and third alignment locations are separated by a second distance different from a third distance separating the second and third alignment locations.

8. The method of claim 1, wherein the overlapping the one or more cells with the first metal layer cut region based on the first metal layer cut region alignment pattern comprises positioning the first metal layer cut region alignment pattern based on a plurality of second metal layer tracks.

9. The method of claim 1, further comprising extending a first metal layer region of the one or more cells to or across a border segment of the one or more cells.

10. The method of claim 9, further comprising overlapping an extended portion of the first metal layer region of the one or more cells with a first metal layer interconnect feature.

11. A method of generating an integrated circuit (IC) layout diagram, the method comprising:
   abutting a first cell with a second cell in the IC layout diagram;
   positioning the first and second cells relative to a first metal layer cut region alignment pattern; and
   overlapping at least one of the first or second cells with a first metal layer cut region based on the first metal layer cut region alignment pattern.

12. The method of claim 11, wherein the first metal layer cut region alignment pattern comprises a pattern pitch equal to a height of each of the first and second cells.

13. The method of claim 11, wherein
   the first cell has a first cell height different from a second cell height of the second cell, and
   the first metal layer cut region alignment pattern comprises a pattern pitch equal to a sum of the first cell height and the second cell height.

14. The method of claim 11, wherein the first metal layer cut region alignment pattern comprises a first sub-pattern corresponding to a first mask set and a second sub-pattern corresponding to a second mask set different from the first mask set.

15. The method of claim 14, wherein the positioning the first and second cells relative to the first metal layer cut region alignment pattern comprises
   aligning a border segment of one of the first or second cells between a second metal layer track and another second metal layer track,
   positioning an alignment location of the first sub-pattern along the second metal layer track, and
   positioning an alignment location of the second sub-pattern along the another second metal layer track.

16. The method of claim 14, wherein the positioning the first and second cells relative to the first metal layer cut region alignment pattern comprises:
   aligning a border segment of one of the first or second cells with a second metal layer track; and
   positioning an alignment location of each of the first and second sub-patterns along the second metal layer track.

17. The method of claim 11, further comprising, based on the IC layout diagram, at least one of:
   fabricating at least one of one or more semiconductor masks, or at least one component in a layer of a semiconductor IC, or
   performing one or more lithographic exposures.

18. A method of generating an integrated circuit (IC) layout diagram, the method comprising:
   positioning one or more cells in the IC layout diagram; and
   overlapping the one or more cells with a first metal layer cut region based on a first metal layer cut region alignment pattern,
   wherein the first metal layer cut region alignment pattern comprises:
      a pattern pitch equal to a height of the one or more cells;
      a first sub-pattern corresponding to a first mask set; and
      a second sub-pattern corresponding to a first mask set.

19. The method of claim 18, wherein the first and second sub-patterns are symmetrical about an axis perpendicular to a direction corresponding to the height of the one or more cells.

20. The method of claim 18, further comprising extending a first metal layer region of the one or more cells in a direction corresponding to the height of the one or more cells.

* * * * *